(12) United States Patent
Xu et al.

(10) Patent No.: US 9,087,806 B2
(45) Date of Patent: *Jul. 21, 2015

(54) BATTERY HEATING CIRCUITS AND METHODS USING RESONANCE COMPONENTS IN SERIES BASED ON CHARGE BALANCING

(75) Inventors: Wenhui Xu, Shenzhen (CN); Yaochuan Han, Shenzhen (CN); Wei Feng, Shenzhen (CN); Qinyao Yang, Shenzhen (CN); Wenjin Xia, Shenzhen (CN); Shibin Ma, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 933 days.

This patent is subject to a terminal disclaimer.

(21) Appl. No.: 13/185,756

(22) Filed: Jul. 19, 2011

(65) Prior Publication Data

US 2012/0025754 A1   Feb. 2, 2012

(30) Foreign Application Priority Data

Jul. 30, 2010  (CN) .......................... 2010 1 0245288
Aug. 30, 2010 (CN) .......................... 2010 1 0274785
May 20, 2011  (CN) .......................... 2011 1 0132362

(51) Int. Cl.
*H02J 7/00* (2006.01)
*H01L 23/34* (2006.01)
(Continued)

(52) U.S. Cl.
CPC ......... *H01L 23/345* (2013.01); *H01M 10/5006* (2013.01); *H01M 10/5016* (2013.01); *H01M 10/5081* (2013.01); *H01M 10/5083* (2013.01); *H01M 10/615* (2015.04);
(Continued)

(58) Field of Classification Search
USPC .................................. 320/139, 128, 150, 153
See application file for complete search history.

(56) References Cited

U.S. PATENT DOCUMENTS 3,654,426 A   4/1972   Brinkmann et al.
3,808,481 A   4/1974   Rippel
(Continued)

FOREIGN PATENT DOCUMENTS

CN   1630129 A   6/2005
CN   1630130 A   6/2005
(Continued)

OTHER PUBLICATIONS

Taiwan Intellectual Property Office, Office Action dated Jan. 10, 2014, in related application TW 100143128.
(Continued)

*Primary Examiner* — Drew A Dunn
*Assistant Examiner* — Zixuan Zhou
(74) *Attorney, Agent, or Firm* — Jones Day

(57) ABSTRACT

Under one aspect, a heating circuit for at least a first battery and a second battery includes a first charging/discharging circuit, which is connected to the first battery, and a second charging/discharging circuit, which is connected to the second battery. The first charging/discharging circuit includes a first damping component, a first current storage component, a first switch unit, and a charge storage component, all of which are connected in a first loop with each other. The second charging/discharging circuit includes a second damping component, a second current storage component, a second switch unit, and the charge storage component, all of which are connected in a second loop with each other.

13 Claims, 11 Drawing Sheets

(51) Int. Cl.
*H01M 10/615* (2014.01)
*H01M 10/625* (2014.01)
*H01M 10/657* (2014.01)
*H01M 10/6571* (2014.01)
*H02M 3/158* (2006.01)

(52) U.S. Cl.
CPC ......... *H01M 10/625* (2015.04); *H01M 10/657* (2015.04); *H01M 10/6571* (2015.04); *H02J 7/0054* (2013.01); *H01L 2924/0002* (2013.01); *H02J 7/0014* (2013.01); *H02J 7/0075* (2013.01); *H02J 7/0091* (2013.01); *H02J 7/0093* (2013.01); *H02M 3/158* (2013.01); *Y02E 60/12* (2013.01); *Y02T 10/7055* (2013.01)

(56) References Cited

U.S. PATENT DOCUMENTS

| | | | |
|---|---|---|---|
| 4,171,508 A | | 10/1979 | Sinclair |
| 4,184,197 A | * | 1/1980 | Cuk et al. ................ 363/16 |
| 4,222,000 A | | 9/1980 | Silvertown et al. |
| 5,362,942 A | | 11/1994 | Vanderslice, Jr. et al. |
| 5,396,165 A | * | 3/1995 | Hwang et al. ............ 323/210 |
| 5,461,556 A | | 10/1995 | Horie et al. |
| 5,523,671 A | | 6/1996 | Stewart |
| 5,561,597 A | * | 10/1996 | Limpaecher ............ 363/59 |
| 5,768,114 A | | 6/1998 | Gruning et al. |
| 5,789,905 A | | 8/1998 | Yamasaki |
| 5,808,469 A | | 9/1998 | Kopera |
| 5,905,371 A | | 5/1999 | Limpaecher |
| 5,943,224 A | | 8/1999 | Mao |
| 5,948,298 A | | 9/1999 | Ijaz |
| 5,990,661 A | | 11/1999 | Ashtiani et al. |
| 6,002,240 A | | 12/1999 | McMahan et al. |
| 6,072,301 A | | 6/2000 | Ashtiani et al. |
| 6,078,163 A | | 6/2000 | Horie et al. |
| 6,142,130 A | | 11/2000 | Ward |
| 6,211,652 B1 | | 4/2001 | Glasgow |
| 6,259,229 B1 | * | 7/2001 | Ashtiani et al. ............ 320/128 |
| 6,340,879 B1 | | 1/2002 | Bläcker |
| 6,771,518 B2 | * | 8/2004 | Orr et al. ................ 363/16 |
| 6,882,061 B1 | | 4/2005 | Ashtiani et al. |
| 7,292,010 B2 | | 11/2007 | Hsu et al. |
| 7,382,102 B2 | | 6/2008 | Ashtiani |
| 7,402,982 B2 | | 7/2008 | Ito et al. |
| 7,876,583 B2 | | 1/2011 | Polivka et al. |
| 8,004,866 B2 | | 8/2011 | Bucella et al. |
| 8,197,502 B2 | | 6/2012 | Smith et al. |
| 8,493,036 B2 | | 7/2013 | Ferrario |
| 2005/0077879 A1 | * | 4/2005 | Near ............ 320/166 |
| 2005/0156578 A1 | | 7/2005 | Kamenoff |
| 2005/0168195 A1 | | 8/2005 | MacDougall |
| 2005/0264237 A1 | | 12/2005 | Ishizuka |
| 2007/0024243 A1 | | 2/2007 | Liu et al. |
| 2007/0091023 A1 | * | 4/2007 | Kosaka et al. ............ 345/68 |
| 2007/0121258 A1 | | 5/2007 | Hachiya |
| 2009/0014436 A1 | | 1/2009 | Toya et al. |
| 2009/0243547 A1 | | 10/2009 | Andelfinger |
| 2011/0095711 A1 | | 4/2011 | Hsieh et al. |
| 2011/0144861 A1 | | 6/2011 | Lakirovich et al. |
| 2011/0273136 A1 | | 11/2011 | Yoshimoto |
| 2012/0024838 A1 | | 2/2012 | Xu et al. |
| 2012/0025755 A1 | | 2/2012 | Xu et al. |
| 2012/0025756 A1 | | 2/2012 | Xu et al. |
| 2012/0025772 A1 | | 2/2012 | Xu et al. |
| 2012/0025774 A1 | | 2/2012 | Xu et al. |
| 2012/0025775 A1 | | 2/2012 | Xu et al. |
| 2012/0025776 A1 | | 2/2012 | Xu et al. |
| 2012/0025777 A1 | | 2/2012 | Xu et al. |
| 2012/0025778 A1 | | 2/2012 | Xu et al. |
| 2012/0025779 A1 | | 2/2012 | Xu et al. |
| 2012/0025780 A1 | | 2/2012 | Xu et al. |
| 2012/0025781 A1 | | 2/2012 | Xu et al. |
| 2012/0025782 A1 | | 2/2012 | Xu et al. |
| 2012/0025783 A1 | | 2/2012 | Xu et al. |
| 2012/0031890 A1 | | 2/2012 | Han et al. |
| 2012/0032642 A1 | | 2/2012 | Xu et al. |
| 2012/0126753 A1 | * | 5/2012 | Carkner ................ 320/129 |
| 2012/0161711 A1 | | 6/2012 | Xu et al. |
| 2012/0279951 A1 | | 11/2012 | Xu et al. |
| 2012/0280658 A1 | | 11/2012 | Xu et al. |
| 2012/0280659 A1 | | 11/2012 | Xu et al. |
| 2012/0299551 A1 | | 11/2012 | Xu et al. |
| 2012/0306432 A1 | | 12/2012 | Xu et al. |
| 2013/0127398 A1 | | 5/2013 | Xu et al. |
| 2013/0134146 A1 | | 5/2013 | Han et al. |
| 2013/0134945 A1 | | 5/2013 | Xu et al. |
| 2013/0141032 A1 | | 6/2013 | Xu et al. |

FOREIGN PATENT DOCUMENTS

| | | |
|---|---|---|
| CN | 1809942 A | 7/2006 |
| CN | 1836356 A | 9/2006 |
| CN | 1291518 C | 12/2006 |
| CN | 101552479 A | 10/2009 |
| CN | 201397868 Y | 2/2010 |
| CN | 101685971 A | 3/2010 |
| CN | 201435426 Y | 3/2010 |
| CN | 201667552 U | 12/2010 |
| CN | 102055042 A | 5/2011 |
| CN | 102074756 A | 5/2011 |
| CN | 201936966 U | 8/2011 |
| CN | 201936967 U | 8/2011 |
| CN | 201936969 U | 8/2011 |
| CN | 201966300 U | 9/2011 |
| CN | 202009059 U | 10/2011 |
| CN | 202042567 U | 11/2011 |
| CN | 202076380 U | 12/2011 |
| CN | 202103139 U | 1/2012 |
| CN | 202121024 U | 1/2012 |
| CN | 102074755 B | 5/2012 |
| CN | 102074758 B | 6/2012 |
| CN | 102074759 B | 6/2012 |
| CN | 102074753 B | 7/2012 |
| CN | 102074756 B | 7/2012 |
| CN | 102074760 B | 7/2012 |
| CN | 102074762 B | 7/2012 |
| CN | 102074761 B | 9/2012 |
| CN | 102088117 B | 9/2012 |
| CN | 102082306 B | 11/2012 |
| CN | 102088116 B | 11/2012 |
| EP | 0 418 919 A2 | 3/1991 |
| EP | 1 930 922 A2 | 6/2008 |
| JP | 4-12472 A | 1/1992 |
| JP | 5022876 A | 1/1993 |
| JP | 2007-166779 A | 6/2007 |
| JP | 4016045 B2 | 12/2007 |
| SU | 813544 B | 3/1981 |
| TW | 220014 B | 2/1994 |
| TW | 269727 B | 2/1996 |
| TW | 344721 B | 11/1998 |
| TW | 200518370 A | 6/2005 |
| TW | 200527793 A | 8/2005 |
| TW | M275625 U | 9/2005 |
| WO | WO 2010/145439 A1 | 12/2010 |

OTHER PUBLICATIONS

Taiwan Intellectual Property Office, Office Action dated Jan. 10, 2014, in related application TW 100143130.
Taiwan Intellectual Property Office, Office Action dated Jan. 10, 2014, in related application TW 100143133.
Taiwan Intellectual Property Office, Office Action dated Jan. 7, 2014, in related application TW 100140587.
Taiwan Intellectual Property Office, Office Action dated Jan. 6, 2014, in related application TW 100140588.
Taiwan Intellectual Property Office, Office Action dated Feb. 17, 2014, in related application TW 100143160.
Taiwan Intellectual Property Office, Office Action dated Jan. 6, 2014, in related application TW 100140590.
Taiwan Intellectual Property Office, Office Action dated Jan. 17, 2014, in related application TW 100141797.

(56) References Cited

OTHER PUBLICATIONS

Taiwan Intellectual Property Office, Office Action dated Jan. 17, 2014, in related application TW 100141802.
United States Patent and Trademark Office, Notice of Allowance mailed Dec. 5, 2013, in related U.S. Appl. No. 13/166,281.
United States Patent and Trademark Office, Notice of Allowance mailed Nov. 8, 2013, in related U.S. Appl. No. 13/166,301.
United States Patent and Trademark Office, Notice of Allowance mailed Jan. 6, 2014, in related U.S. Appl. No. 13/189,096.
United States Patent and Trademark Office, Notice of Allowance mailed Jan. 6, 2014, in related U.S. Appl. No. 13/187,874.
United States Patent and Trademark Office, Office Action mailed Nov. 20, 2013, in related U.S. Appl. No. 13/168,004.
United States Patent and Trademark Office, Office Action mailed Nov. 22, 2013, in related U.S. Appl. No. 13/168,014.
United States Patent and Trademark Office, Final Office Action mailed Feb. 25, 2014, in related U.S. Appl. No. 13/170,021.
United States Patent and Trademark Office, Office Action mailed Jan. 6, 2014, in related U.S. Appl. No. 13/187,266.
United States Patent and Trademark Office, Office Action mailed Jan. 3, 2014, in related U.S. Appl. No. 13/184,906.
United States Patent and Trademark Office, Office Action mailed Jan. 2, 2014, in related U.S. Appl. No. 13/189,114.
United States Patent and Trademark Office, Office Action mailed Dec. 3, 2013, in related U.S. Appl. No. 13/187,279.
United States Patent and Trademark Office, Office Action mailed Dec. 4, 2013, in related U.S. Appl. No. 13/187,890.
United States Patent and Trademark Office, Office Action mailed Jan. 6, 2014, in related U.S. Appl. No. 13/541,487.
United States Patent and Trademark Office, Office Action mailed Dec. 4, 2013, in related U.S. Appl. No. 13/748,525.
United States Patent and Trademark Office, Office Action mailed Jan. 15, 2014, in related U.S. Appl. No. 13/749,480.
China Patent Office, Office Action dated Sep. 21, 2011, in related application CN 201010603658.3.
China Patent Office, Office Action dated Jul. 27, 2011, in related application CN 201010603717.7.
China Patent Office, Office Action dated Jul. 27, 2011, in related application CN 201010604714.5.
China Patent Office, Office Action dated Sep. 5, 2011, in related application CN 201010606082.6.
China Patent Office, Office Action dated Sep. 21, 2011, in related application CN 201010605772.X.
China Patent Office, Office Action dated Feb. 2, 2012, in related application CN 201010604777.0.
China Patent Office, Office Action dated Sep. 2, 2011, in related application CN 201010604777.0.
China Patent Office, Office Action dated Jan. 9, 2012, in related application CN 201010604729.1.
China Patent Office, Office Action dated Jul. 18, 2011, in related application CN 201010604729.1.
China Patent Office, Office Action dated Dec. 28, 2011, in related application CN 201010603719.6.
China Patent Office, Office Action dated Jul. 28, 2011, in related application CN 201010603719.6.
China Patent Office, Office Action dated Jan. 5, 2012, in related application CN 201010603471.3.
China Patent Office, Office Action dated Jul. 15, 2011, in related application CN 201010603471.3.
China Patent Office, Office Action dated Jul. 27, 2011, in related application CN 201010603414.5.
China Patent Office, Office Action dated Nov. 16, 2011, in related application CN 201010603414.5.
China Patent Office, Office Action dated Aug. 1, 2011, in related application CN 201010603669.1.
China Patent Office, Office Action dated Sep. 15, 2011, in related application CN 201010604677.8.
China Patent Office, Office Action dated Feb. 2, 2012, in related application CN 201010604744.6.
China Patent Office, Office Action dated Sep. 20, 2011, in related application CN 201010604744.6.
China Patent Office, Office Action dated Oct. 25, 2011, in related application CN 201110080853.7.
China Patent Office, Office Action dated Nov. 1, 2011, in related application CN 201110081219.5.
China Patent Office, Office Action dated Jan. 21, 2012, in related application CN 201110081276.3.
China Patent Office, Office Action dated Jun. 5, 2012, in related application CN 201110081276.3.
China Patent Office, Office Action dated May 16, 2012, in related application CN 201110137264.8.
China Patent Office, Office Action dated Jan. 21, 2012, in related application CN 201110132362.2.
China Patent Office, Office Action dated Jan. 21, 2012, in related application CN 201110134005.X.
China Patent Office, Office Action dated May 2, 2012, in related application CN 201110134005.X.
European Patent Office, Extended European Search Report dated Sep. 13, 2011, in related application EP 11166955.2.
European Patent Office, Extended European Search Report dated Nov. 30, 2011, in related application EP 11166938.8.
European Patent Office, Extended European Search Report dated Dec. 15, 2011, in related application EP 11166941.2.
European Patent Office, Extended European Search Report dated Sep. 16, 2011, in related application EP 11166949.5.
European Patent Office, Extended European Search Report dated Oct. 6, 2011, in related application EP 11166925.5.
European Patent Office, European Search Report dated Sep. 29, 2011, in related application EP 11166958.6.
European Patent Office, Extended European Search Report dated Jan. 25, 2012, in related application EP 11166952.9.
European Patent Office, European Search Report dated Sep. 21, 2011, in related application EP 11166969.3.
European Patent Office, European Search Report dated Sep. 1, 2011, in related application EP 11166903.2.
European Patent Office, Extended European Search Report dated Nov. 8, 2011, in related application EP 11166872.9.
European Patent Office, Extended European Search Report dated Nov. 25, 2011, in related application EP 11166882.8.
European Patent Office, Extended European Search Report dated Nov. 25, 2011, in related application EP 11166897.6.
European Patent Office, Extended European Search Report dated Sep. 6, 2011, in related application EP 11166900.8.
European Patent Office, Extended European Search Report dated Sep. 23, 2011, in related application EP 11166914.9.
European Patent Office, Extended European Search Report dated Nov. 8, 2011, in related application EP 11166920.6.
European Patent Office, Extended European Search Report dated Sep. 27, 2011, in related application EP 11167066.7.
European Patent Office, Extended European Search Report dated Sep. 8, 2011, in related application EP 11166902.4.
European Patent Office, Extended European Search Report dated Oct. 6, 2011, in related application EP 11167128.5.
Patent Cooperation Treaty, International Search Report and Written Opinion, dated Sep. 1, 2011, in related application PCT/CN2011/074449.
Patent Cooperation Treaty, International Search Report and Written Opinion, dated Aug. 18, 2011, in related application PCT/CN2011/074453.
Patent Cooperation Treaty, International Search Report and Written Opinion, dated Aug. 11, 2011, in related application PCT/CN2011/074463.
Patent Cooperation Treaty, International Search Report and Written Opinion, dated Aug. 25, 2011, in related application PCT/CN2011/074458.
Patent Cooperation Treaty, International Search Report and Written Opinion, dated Aug. 11, 2011, in related application PCT/CN2011/074462.
Patent Cooperation Treaty, International Search Report and Written Opinion, dated Aug. 11, 2011, in related application PCT/CN2011/074457.

(56) References Cited

OTHER PUBLICATIONS

Patent Cooperation Treaty, International Search Report and Written Opinion, dated Aug. 25, 2011, in related application PCT/CN2011/074459.
Patent Cooperation Treaty, International Search Report and Written Opinion, dated Aug. 18, 2011, in related application PCT/CN2011/074456.
Patent Cooperation Treaty, International Search Report and Written Opinion, dated Aug. 18, 2011, in related application PCT/CN2011/074460.
Patent Cooperation Treaty, International Search Report and Written Opinion, dated Aug. 11, 2011, in related application PCT/CN2011/074433.
Patent Cooperation Treaty, International Search Report and Written Opinion, dated Aug. 18, 2011, in related application PCT/CN2011/074436.
Patent Cooperation Treaty, International Search Report and Written Opinion, dated Aug. 25, 2011, in related application PCT/CN2011/074438.
Patent Cooperation Treaty, International Search Report and Written Opinion, dated Aug. 11, 2011, in related application PCT/CN2011/074440.
Patent Cooperation Treaty, International Search Report and Written Opinion, dated Aug. 25, 2011, in related application PCT/CN2011/074455.
Patent Cooperation Treaty, International Search Report and Written Opinion, dated Aug. 11, 2011, in related application PCT/CN2011/074461.
Patent Cooperation Treaty, International Search Report and Written Opinion, dated Sep. 1, 2011, in related application PCT/CN2011/074531.
Patent Cooperation Treaty, International Search Report and Written Opinion, dated Aug. 18, 2011, in related application PCT/CN2011/074442.
Patent Cooperation Treaty, International Search Report and Written Opinion, dated Jul. 21, 2011, in related application PCT/CN2011/074536.
United States Patent and Trademark Office, Office Action mailed Jul. 16, 2013, in related U.S. Appl. No. 13/166,281.
United States Patent and Trademark Office, Office Action mailed May 31, 2013, in related U.S. Appl. No. 13/168,004.
United States Patent and Trademark Office, Office Action mailed May 22, 2013, in related U.S. Appl. No. 13/168,014.
United States Patent and Trademark Office, Office Action mailed Jul. 5, 2013, in related U.S. Appl. No. 13/170,021.
United States Patent and Trademark Office, Office Action mailed Jul. 30, 2013, in related U.S. Appl. No. 13/166,301.
United States Patent and Trademark Office, Office Action mailed Sep. 5, 2013, in related U.S. Appl. No. 13/189,096.
United States Patent and Trademark Office, Office Action mailed Aug. 29, 2013, in related U.S. Appl. No. 13/187,874.
United States Patent and Trademark Office, Office Action mailed Aug. 29, 2013, in related U.S. Appl. No. 13/189,114.
United States Patent and Trademark Office, Office Action mailed Sep. 30, 2013, in related U.S. Appl. No. 13/170,044.
United States Patent and Trademark Office, Office Action mailed Jun. 19, 2013, in patent U.S. Appl. No. 13/187,890.
United States Patent and Trademark Office, Office Action mailed Sep. 26, 2014, in related U.S. Appl. No. 13/544,881.
United States Patent and Trademark Office, Office Action mailed Sep. 3, 2014, in related U.S. Appl. No. 13/486,883.
United States Patent and Trademark Office, Office Action mailed Sep. 11, 2014, in related U.S. Appl. No. 13/465,906.
United States Patent and Trademark Office, Office Action mailed Sep. 11, 2014, in related patent U.S. Appl. No. 13/545,885.
United States Patent and Trademark Office, Notice of Allowance mailed Oct. 6, 2014, in related U.S. Appl. No. 13/168,014.
United States Patent and Trademark Office, Notice of Allowance mailed Oct. 6, 2014, in related U.S. Appl. No. 13/184,906.
United States Patent and Trademark Office, Notice of Allowance mailed Oct. 6, 2014, in related U.S. Appl. No. 13/187,279.
United States Patent and Trademark Office, Notice of Allowance mailed Oct. 3, 2014, in related U.S. Appl. No. 13/187,890.
United States Patent and Trademark Office, Notice of Allowance mailed Oct. 7, 2014, in related U.S. Appl. No. 13/541,487.
United States Patent and Trademark Office, Notice of Allowance mailed Oct. 6, 2014, in related U.S. Appl. No. 13/748,525.
United States Patent and Trademark Office, Notice of Allowance mailed Oct. 6, 2014, in related U.S. Appl. No. 13/749,480.
United States Patent and Trademark Office, Office Action mailed Nov. 13, 2014, in related U.S. Appl. No. 13/168,004.
United States Patent and Trademark Office, Office Action mailed Nov. 17, 2014, in related U.S. Appl. No. 13/187,266.
United States Patent and Trademark Office, Office Action mailed Jun. 10, 2014, in related U.S. Appl. No. 13/168,004.
United States Patent and Trademark Office, Office Action mailed Jun. 18, 2014, in related U.S. Appl. No. 13/168,014.
United States Patent and Trademark Office, Office Action mailed Jun. 16, 2014, in related U.S. Appl. No. 13/184,879.
United States Patent and Trademark Office, Office Action mailed Jun. 20, 2014, in related U.S. Appl. No. 13/184,894.
United States Patent and Trademark Office, Office Action mailed Jun. 25, 2014, in related U.S. Appl. No. 13/187,266.
United States Patent and Trademark Office, Office Action mailed Jun. 24, 2014, in related U.S. Appl. No. 13/184,906.
United States Patent and Trademark Office, Office Action mailed Jun. 17, 2014, in related U.S. Appl. No. 13/185,744.
United States Patent and Trademark Office, Office Action mailed Jun. 16, 2014, in related U.S. Appl. No. 13/184,915.
United States Patent and Trademark Office, Office Action mailed Jun. 24, 2014, in related U.S. Appl. No. 13/187,279.
United States Patent and Trademark Office, Office Action mailed Jul. 7, 2014, in related U.S. Appl. No. 13/187,890.
United States Patent and Trademark Office, Office Action mailed Jun. 25, 2014, in related U.S. Appl. No. 13/541,487.
United States Patent and Trademark Office, Office Action mailed Jun. 26, 2014, in related U.S. Appl. No. 13/748,525.
United States Patent and Trademark Office, Office Action mailed Jun. 24, 2014, in related U.S. Appl. No. 13/749,480.
United States Patent and Trademark Office, Notice of Allowance mailed Apr. 25, 2014, in related U.S. Appl. No. 13/166,281.
United States Patent and Trademark Office, Notice of Allowance mailed Jun. 24, 2014, in related U.S. Appl. No. 13/170,021.
United States Patent and Trademark Office, Notice of Allowance mailed May 2, 2014, in related U.S. Appl. No. 13/166,301.
United States Patent and Trademark Office, Notice of Allowance mailed Jun. 18, 2014, in related U.S. Appl. No. 13/189,096.
United States Patent and Trademark Office, Notice of Allowance mailed May 8, 2014, in related U.S. Appl. No. 13/187,874.
United States Patent and Trademark Office, Notice of Allowance mailed Apr. 28, 2014, in related U.S. Appl. No. 13/189,114.
United States Patent and Trademark Office, Notice of Allowance mailed May 22, 2014, in related U.S. Appl. No. 13/170,044.
United States Patent and Trademark Office, Office Action mailed Dec. 11, 2014, in related U.S. Appl. No. 13/184,879.
United States Patent and Trademark Office, Office Action mailed Dec. 24, 2014, in related U.S. Appl. No. 13/184,894.
United States Patent and Trademark Office, Office Action mailed Dec. 31, 2014, in related U.S. Appl. No. 13/185,744.
United States Patent and Trademark Office, Office Action mailed Jan. 13, 2015, in related U.S. Appl. No. 13/184,915.
United States Patent and Trademark Office, Office Action mailed Feb. 13, 2015, in related U.S. Appl. No. 13/465,906.
United States Patent and Trademark Office, Notice of Allowance mailed Feb. 18, 2015, in related U.S. Appl. No. 13/168,004.
United States Patent and Trademark Office, Corrected Notice of Allowability mailed Feb. 11, 2015, in related U.S. Appl. No. 13/187,279.
United States Patent and Trademark Office, Notice of Allowance mailed Mar. 3, 2015, in related U.S. Appl. No. 13/544,881.

(56) References Cited

OTHER PUBLICATIONS

United States Patent and Trademark Office, Corrected Notice of Allowability mailed Feb. 23, 2015, in related U.S. Appl. No. 13/748,525.

United States Patent and Trademark Office, Office Action mailed Mar. 25, 2015, in related patent application U.S. Appl. No. 13/187,266.

United States Patent and Trademark Office, Office Action mailed Apr. 1, 2015, in related patent application U.S. Appl. No. 13/747,387.

United States Patent and Trademark Office, Office Action mailed Apr. 13, 2015, in related patent application U.S. Appl. No. 13/545,885.

United States Patent and Trademark Office, Corrected Notice of Allowability mailed Apr. 3, 2015, in related patent application U.S. Appl. No. 13/168,004.

United States Patent and Trademark Office, Notice of Allowance mailed Mar. 18, 2015, in related patent application U.S. Appl. No. 13/184,879.

United States Patent and Trademark Office, Notice of Allowance mailed Mar. 27, 2015, in related patent application U.S. Appl. No. 13/184,894.

United States Patent and Trademark Office, Notice of Allowance mailed Mar. 23, 2015, in related patent application U.S. Appl. No. 13/185,744.

United States Patent and Trademark Office, Notice of Allowance mailed Mar. 30, 2015, in related patent application U.S. Appl. No. 13/184,915.

United States Patent and Trademark Office, Notice of Allowance mailed Apr. 29, 2015, in related patent application U.S. Appl. No. 13/185,756.

United States Patent and Trademark Office, Supplemental Notice of Allowability mailed Mar. 17, 2015, in related patent application U.S. Appl. No. 13/544,881.

United States Patent and Trademark Office, Notice of Allowance mailed Mar. 27, 2015, in related patent application U.S. Appl. No. 13/747,378.

United States Patent and Trademark Office, Notice of Allowance mailed Mar. 18, 2015, in related patent application U.S. Appl. No. 13/486,883.

United States Patent and Trademark Office, Corrected Notice of Allowability mailed May 13, 2015. In related patent application U.S. Appl. No. 13/168,004.

United States Patent and Trademark Office. Corrected Notice of Allowability mailed May 20, 2015, in related patent application U.S. Appl. No. 13/184,894.

United States Patent and Trademark Office, Corrected Notice of Allowability mailed May 21, 2015, in related patent application U.S. Appl. No. 13/184,915.

United States Patent and Trademark Office, Supplemental Notice of Allowability mailed May 20, 2015, in related patent application U.S. Appl. No. 13/544,881.

United States Patent and Trademark Office. Supplemental Notice of Allowability mailed May 13, 2015, in related patent application U.S. Appl. No. 13/747,378.

United States Patent and Trademark Office. Notice of Allowance mailed May 20, 2015. In related patent application U.S. Appl. No. 13/465,906.

* cited by examiner

US 9,087,806 B2

BATTERY HEATING CIRCUITS AND METHODS USING RESONANCE COMPONENTS IN SERIES BASED ON CHARGE BALANCING

1. CROSS-REFERENCE TO RELATED APPLICATIONS

This application claims priority to Chinese Patent Application No. 201010245288.0, filed Jul. 30, 2010, Chinese Patent Application No. 201010274785.3, filed Aug. 30, 2010, and Chinese Patent Application No. 201110132362.2, filed May 20, 2011, all these three applications being incorporated by reference herein for all purposes.

Additionally, this application is related to International Application Publication No. WO2010/145439A1 and Chinese Application Publication No. CN102055042A, both these two applications being incorporated by reference herein for all purposes.

2. BACKGROUND OF THE INVENTION

The present invention pertains to electric and electronic field, in particular related to a battery heating circuit.

Considering cars need to run under complex road conditions and environmental conditions or some electronic devices are used under harsh environmental conditions, the battery, which serves as the power supply unit for electric-motor cars or electronic devices, need to be adaptive to these complex conditions. In addition, besides these conditions, the service life and charge/discharge cycle performance of the battery need to be taken into consideration; especially, when electric-motor cars or electronic devices are used in low temperature environments, the battery needs to have outstanding low-temperature charge/discharge performance and higher input/output power performance.

Usually, under low temperature conditions, the resistance of the battery will increase, and so will the polarization; therefore, the capacity of the battery will be reduced.

To keep the capacity of the battery and improve the charge/discharge performance of the battery under low temperature conditions, some embodiments of the present invention provide a battery heating circuit.

3. BRIEF SUMMARY OF THE INVENTION

The objective of certain embodiments of the present invention is to provide a battery heating circuit, in order to solve the problem of decreased capacity of the battery caused by increased resistance and polarization of the battery under low temperature conditions.

Certain embodiments of the present invention provide a battery heating circuit, wherein: the battery comprises a battery E1 and a battery E2, the heating circuit comprises: a first charging/discharging circuit, which is connected with the battery E1, and comprises a damping component R1, a current storage component L1, a first switch unit and a charge storage component C, all of which are connected in series to each other; and a second charging/discharging circuit, which is connected to the battery E2, and comprises a damping component R2, a current storage component L2, a second switch unit and the charge storage component C, all of which are connected in series with each other.

The battery heating circuit provided in certain embodiments of the present invention can be used to heat up multiple batteries simultaneously, or heat up some batteries among the multiple batteries separately by controlling the first switch unit and/or the second switch unit. In addition, if the electric quantities in the batteries are unbalanced among them, the battery heating circuit provided in certain embodiments of the present invention can be used to make the batteries with electric quantity more than the average electric quantity transfer the excessive electric quantity into the charge storage component C through a charging/discharging circuit; then, the energy stored in the charge storage component C can be transfers to batteries with less electric quantity through another charging/discharging circuit, so as to attain the objective of electric quantity balance among the batteries.

Other characteristics and advantages of the present invention will be further described in detail in the following section for embodiments.

4. BRIEF DESCRIPTION OF THE DRAWINGS

The accompanying drawings, as a part of this description, are provided here to facilitate further understanding of the present invention, and are used in conjunction with the following embodiments to explain the present invention, but shall not be comprehended as constituting any limitation on the present invention. In the figures.

5. DETAILED DESCRIPTION OF THE INVENTION

Figure 1:
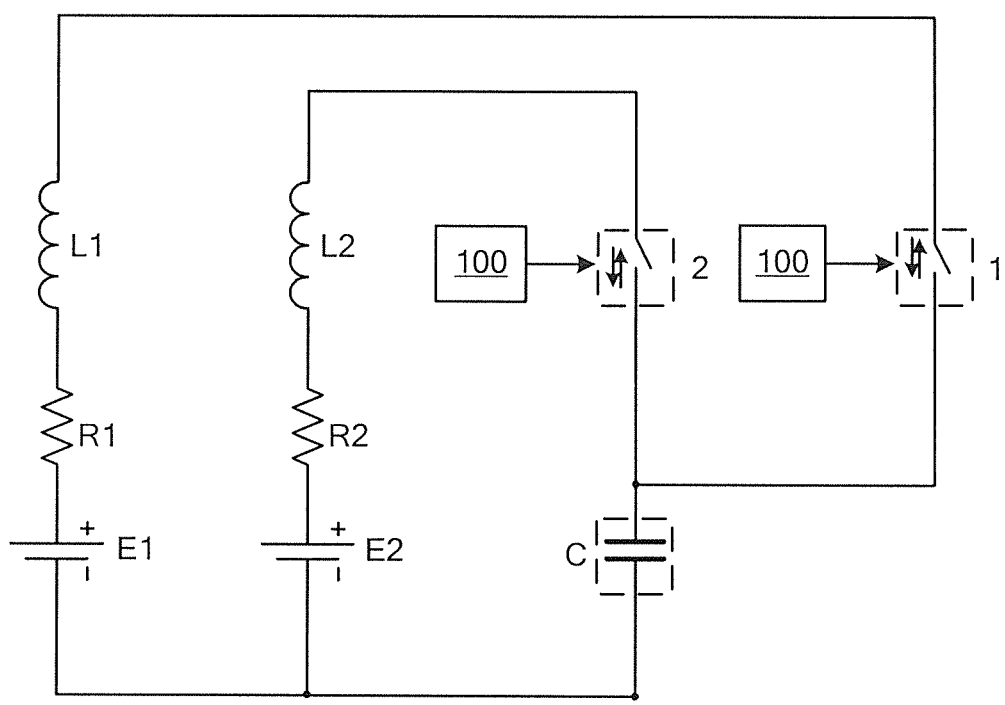
FIG. 1 is a schematic diagram of the battery heating circuit provided in one embodiment of the present invention.

Certain embodiments of the present invention are described in detail below, with reference to the accompanying drawings. It should be appreciated that the embodiments described here are only provided to describe and explain the present invention, but shall not be deemed as constituting any limitation on the present invention.

It is noted that, unless otherwise specified, when mentioned hereafter in this description, the term "switching control module" may refer to any controller that can output control commands (e.g., pulse waveforms) under preset conditions or at preset times and thereby control the switch unit connected to it to switch on or switch off accordingly, according to some embodiments. For example, the switching control module can be a PLC. Unless otherwise specified, when mentioned hereafter in this description, the term "switch" may refer to a switch that enables ON/OFF control by using electrical signals or enables ON/OFF control on the basis of the characteristics of the component according to certain embodiments. For example, the switch can be either a one-way switch (e.g., a switch composed of a two-way switch and a diode connected in series, which can be conductive in one direction) or a two-way switch (e.g., a Metal Oxide Semiconductor Field Effect Transistor (MOSFET) or an IGBT with an anti-parallel freewheeling diode). Unless otherwise specified, when mentioned hereafter in this description, the term "two-way switch" may refer to a switch that can be conductive in two directions, which can enable ON/OFF control by using electrical signals or enable ON/OFF control on the basis of the characteristics of the component according to some embodiments. For example, the two-way switch can be a MOSFET or an IGBT with an anti-parallel freewheeling diode. Unless otherwise specified, when mentioned hereafter in this description, the term "one-way semiconductor component" may refer to a semiconductor component that can be conductive in one direction, such as a diode, according to certain embodiments. Unless otherwise specified, when mentioned hereafter in this description, the term "charge storage component" may refer to any device that can enable charge storage, such as a capacitor, according to some embodiments. Unless otherwise specified, when mentioned hereafter in this description, the term "current storage component" may refer to any device that can store current, such as an inductor, according to certain embodiments. Unless otherwise specified, when mentioned hereafter in this description, the term "forward direction" may refer to the direction in which the energy flows from the battery to the energy storage circuit, and the term "reverse direction" may refer to the direction in which the energy flows from the energy storage circuit to the battery, according to some embodiments. Unless otherwise specified, when mentioned hereafter in this description, the term "battery" may comprise primary battery (e.g., dry battery or alkaline battery, etc.) and secondary battery (e.g., lithium-ion battery, nickel-cadmium battery, nickel-hydrogen battery, or lead-acid battery, etc.), according to certain embodiments. Unless otherwise specified, when mentioned hereafter in this description, the term "damping component" may refer to any device that inhibits current flow and thereby enables energy consumption, such as a resistor, etc., according to some embodiments. Unless otherwise specified, when mentioned hereafter in this description, the term "main loop" may refer to a loop composed of battery, damping component, switch unit and energy storage circuit connected in series according to certain embodiments.

It should be noted specially that, considering different types of batteries have different characteristics, in some embodiments of the present invention, "battery" may refer to an ideal battery that does not have internal parasitic resistance and parasitic inductance or has very low internal parasitic resistance and parasitic inductance, or may refer to a battery pack that has internal parasitic resistance and parasitic inductance; therefore, those skilled in the art should appreciate that if the battery is an ideal battery that does not have internal parasitic resistance and parasitic inductance or has very low internal parasitic resistance and parasitic inductance, the damping component R1 may refer to a damping component external to the battery and the current storage component L1 may refer to a current storage component external to the battery; if the battery is a battery pack that has internal parasitic resistance and parasitic inductance, the damping component R1 may refer to a damping component external to the battery or refer to the parasitic resistance in the battery pack, and the current storage component L1 may refer to a current storage component external to the battery or refer to the parasitic inductance in the battery pack, according to certain embodiments.

To ensure the normal service life of the battery, according to some embodiments, the battery can be heated under low temperature condition, which is to say, when the heating condition is met, the heating circuit is controlled to start heating for the battery; when the heating stop condition is met, the heating circuit is controlled to stop heating, according to certain embodiments.

In the actual application of battery, the battery heating condition and heating stop condition can be set according to the actual ambient conditions, to ensure normal charge/discharge performance of the battery, according to some embodiments.

FIG. 1 is a schematic diagram of the battery heating circuit provided in one embodiment of the present invention. As shown in FIG. 1, one embodiment of the present invention provides a battery heating circuit, wherein: the battery comprises a battery E1 and a battery E2, the heating circuit comprises: a first charging/discharging circuit, which is connected with the battery E1, and comprises a damping component R1, a current storage component L1, a first switch unit 1 and a charge storage component C, all of which are connected in series to each other; and a second charging/discharging circuit, which is connected to the battery E2, and comprises a damping component R2, a current storage component L2, a second switch unit 2 and the charge storage component C, all of which are connected in series with each other.

Wherein: the damping component R1 and damping component R2 can be the parasitic resistance in the battery E1 and battery E2 respectively; the current storage component L1 and current storage component L2 can be the parasitic inductance in the battery E1 and battery E2 respectively.

Wherein: the heating circuit can further comprise a switching control module 100, which is connected with the first switch unit 1 and second switch unit 2, and the switching control module 100 is configured to control ON/OFF of the first switch unit 1 and second switch unit 2, so that the energy flows back-and-forth between the battery E1 and the first charging/discharging circuit and/or flows back-and-forth between the battery E2 and the second charging/discharging circuit when the switch unit 1 and/or the second switch unit 2 switch(es) on, so that the damping component R1 and/or damping component R2 generate(s) heat, and thereby attain the objective of heating up the battery.

The switching control module 100 can be a separate controller, which, by using internal program setting, achieves ON/OFF control of different external switches; or, the switching control module 100 can be a plurality of controllers, for example, a switching control module 100 can be set for each external switch; or, the plurality of switching control modules 100 can be integrated into an assembly. Certain embodiments of the present invention do not impose any limitation to the form of implementation of the switching control module 100.

Preferably, the switching control module 100 is configured to control the first switch unit 1 to switch on and control the second switch unit 2 to switch off so that the battery E1 charges the charge storage component C, when the electric quantity in the battery E1 is more than the electric quantity in the battery E2; then, control the first switch unit 1 to switch off and control the second switch unit 2 to switch on, so that the charge storage component C charges the electric quantity stored in it into the battery E2, when the current flowing through the first charging/discharging circuit reaches zero after the positive half cycle, so as to achieve the objective of energy balance between the batteries.

FIGS. 2A-2F are schematic diagrams of embodiments of the first switch unit and/or the second switch unit shown in FIG. 1. Hereunder the embodiments of the first switch unit and/or second switch unit will be detailed, with reference to FIG. 2A-2F.

Figure 2A:
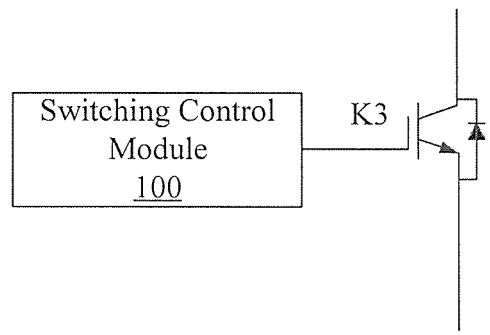
FIGS. 2A-2F are schematic diagrams of one embodiment of the first switch unit and/or the second switch unit shown in FIG. 1.

To achieve to-and-fro energy flow between the battery and the charging/discharging circuit, in one embodiment of the present invention, the first switch unit 1 and/or second switch unit 2 can be two-way switches K3, as shown in FIG. 2A. The switching control module 100 controls ON/OFF of the two-way switch K3; when the battery is to be heat up, the two-way switch K3 can be controlled to switch on; if heating is to be paused or is not needed, the two-way switch K3 can be controlled to switch off.

Employing a separate two-way switch K3 to implement the switch unit can simplify the circuit, reduce system footprint, and simplify the implementation; however, to implement cut-off of reverse current, the following embodiment of the switch unit is further provided in the present invention.

Preferably, the switch unit 1 and/or second switch unit 2 can comprise a first one-way branch configured to implement energy flow from the battery to the charging/discharging circuit, and a second one-way branch configured to implement energy flow from the charging/discharging circuit to the battery; wherein: the switching control module 100 is connected to either or both of the first one-way branch and second one-way branch, to control ON/OFF the connected branches.

When the battery is to be heated, both the first one-way branch and the second one-way branch can be controlled to switch on; when heating is to be paused, either or both of the first one-way branch and the second one-way branch can be controlled to switch off; when heating is not needed, both of the first one-way branch and the second one-way branch can be controlled to switch off. Preferably, both of the first one-way branch and the second one-way branch are subject to the control of the switching control module 100; thus, energy flow in forward direction and reverse direction can be implemented flexibly.

Figure 2B:
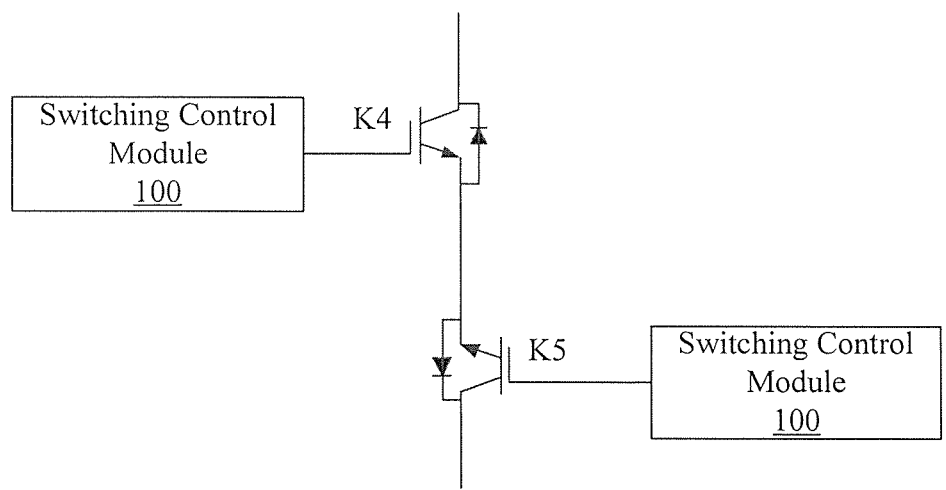

In another embodiment of the switch units, as shown in FIG. 2B, the first switch unit 1 and/or second switch unit 2 can comprise a two-way switch K4 and a two-way switch K5, wherein: the two-way switch K4 and two-way switch K5 are connected in series opposite to each other, to form the first one-way branch and the second one-way branch; the switching control module 100 is connected with the two-way switch K4 and the two-way switch K5 respectively, to control ON/OFF of the first one-way branch and second one-way branch by controlling ON/OFF of the two-way switch K4 and two-way switch K5.

When the battery is to be heated, the two-way switches K4 and K5 can be controlled to switch on; when heating is to be paused, either or both of the two-way switch K4 and two-way switch K5 can be controlled to switch off; when heating is not needed, both of the two-way switch K4 and two-way switch K5 can be controlled to switch off. In such an implementation of switch units, the first one-way branch and the second one-way branch can be controlled separately to switch on or off, and therefore energy flow in forward direction and reverse direction in the circuit can be implemented flexibly.

Figure 2C:
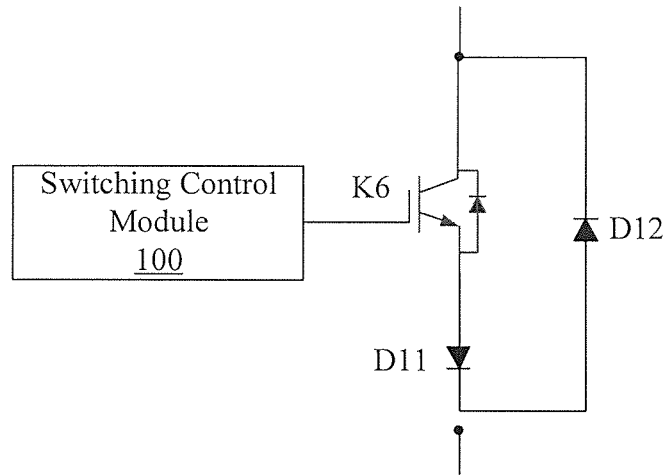

In another embodiment of the switch units, as shown in FIG. 2C, the first switch unit 1 and/or second switch unit 2 can comprise a switch K6, a one-way semiconductor component D11 and a one-way semiconductor component D12, wherein: the switch K6 and the one-way semiconductor component D11 are connected in series with each other to form the first one-way branch; the one-way semiconductor component D12 forms the second one-way branch; the switching control module 100 is connected with the switch K6, to control ON/OFF of the first one-way branch by controlling ON/OFF of the switch K6. In the switch unit shown in FIG. 2C, when heating is needed, the switch K6 can be controlled to switch on; when heating is not needed, the switch K6 can be controlled to switch off.

Figure 2D:
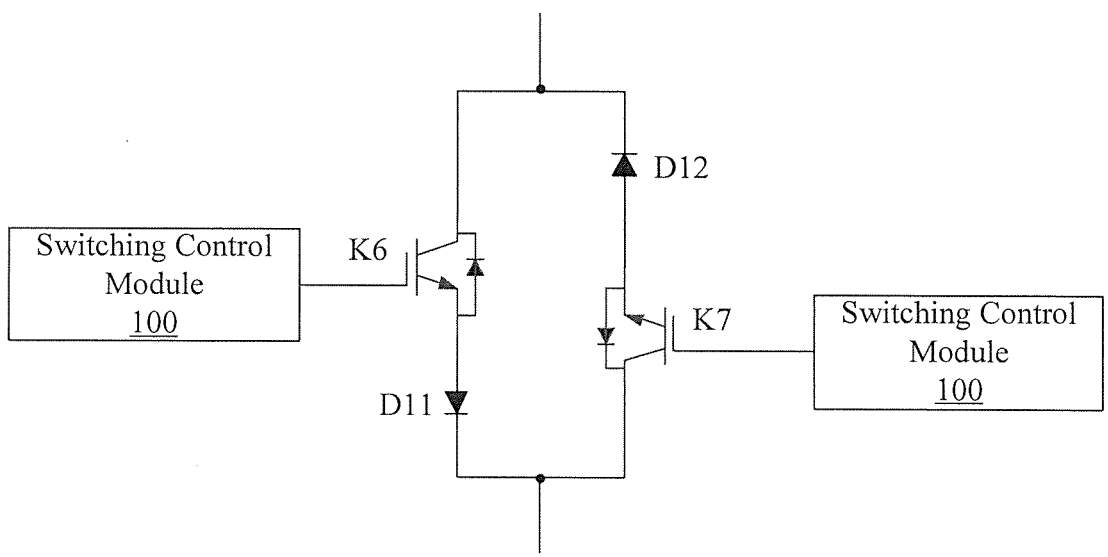

Though the implementation of switch units shown in FIG. 2C implements to-and-fro energy flow along separate branches, it can't implement energy flow cut-off function in reverse direction. The present invention further puts forward another embodiment of switch units, as shown in FIG. 2D, the first switch unit 1 and/or second switch unit 2 can further comprise a switch K7 in the second one-way branch, wherein: the switch K7 is connected with the one-way semiconductor component D12 in series, the switching control module 100 is also connected with the switch K7, and the switching control module 100 is configured to control ON/OFF of the second one-way branch by controlling ON/OFF of the switch K7. Thus, in the switch unit shown in FIG. 2D, since switches (i.e., switch K6 and switch K7) exist in both one-way branches, energy flow cut-off function in forward direction and reverse direction is implemented.

Figure 2E:
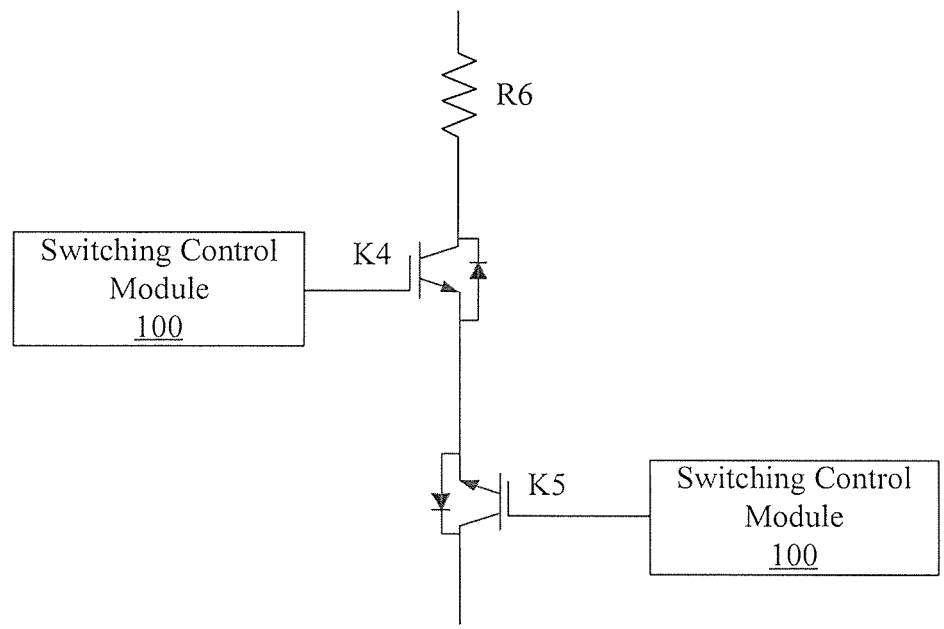
Figure 2F:
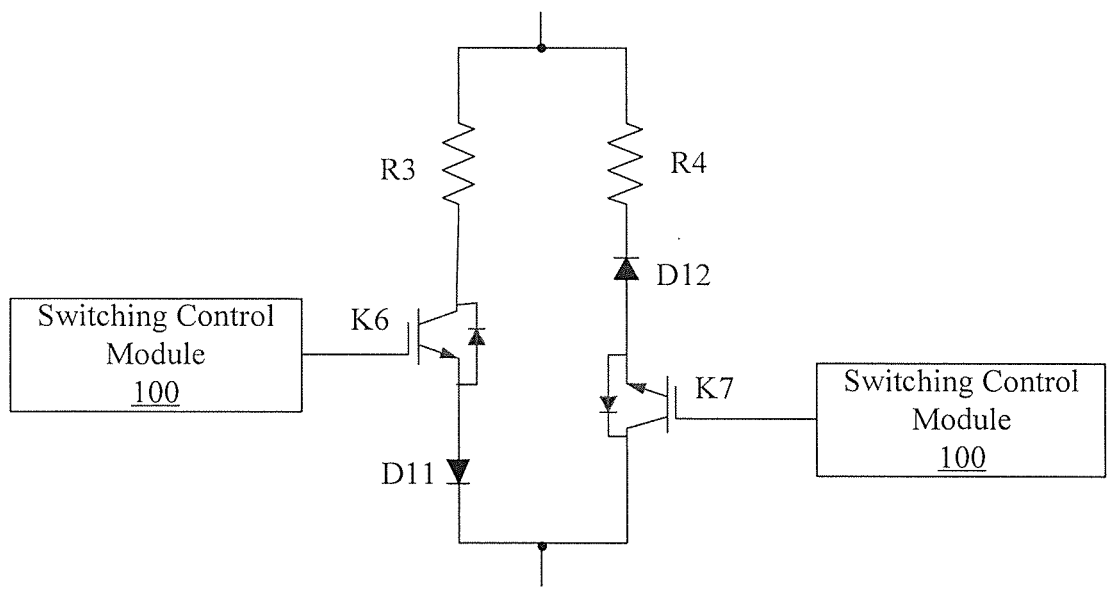

Preferably, the first switch unit 1 and/or second switch unit 2 can further comprise a resistor connected with the first one-way branch and/or second one-way branch, to reduce the current in the charging/discharging circuit, so as to avoid damage to the batteries due to over-current. For example, a resistor R6 connected in series with the two-way switch K4 and two-way switch K5 can be added in the switch units shown in FIG. 2B, to obtain another implementation of the switch units, as shown in FIG. 2E. FIG. 2F shows one embodiment of the switch units, which is obtained by connecting resistor R3 and resistor R4 in series in the two one-way branches in the switch units shown in FIG. 2D, respectively.

In one embodiment in which the energy flows back-and-forth between the battery and the charging/discharging circuit, the switch unit can be switched off at any point of time in one or more cycles, which is to say, the switch unit can be switched off at any time, for example, the switch unit can be switched off when the current flows through the switch unit in forward direction or reverse direction, and is equal to zero or not equal to zero. A specific implementation form of switch unit can be selected, depending on the needed cut-off strategy; if only current flow cut-off in forward direction is needed, the implementation form of switch unit shown in FIG. 2A or FIG. 2C can be selected; if current flow cut-off in forward direction and reverse direction is needed, the switch unit with two controllable one-way branches shown in FIG. 2B or FIG. 2D can be selected.

Figure 3:
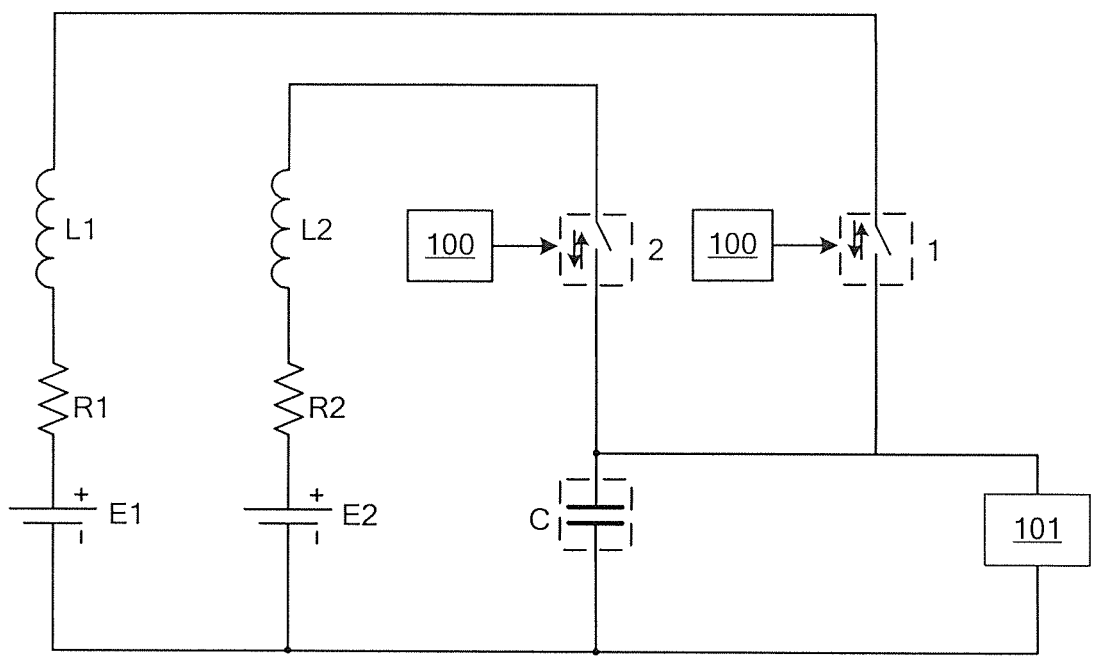
FIG. 3 is a schematic diagram of the first embodiment of the battery heating circuit provided in the present invention.

FIG. 3 is a schematic diagram of one embodiment of the battery heating circuit provided in the present invention. As shown in FIG. 3, the heating circuit provided in one embodiment of the present invention can further comprise a polarity inversion unit 101, which is connected with the charge storage component C, and the polarity inversion unit 101 is configured to invert the voltage polarity of the charge storage component C. The switching control module 100 is connected with the first switch unit 1, second switch unit 2 and polarity inversion unit 101, and is configured to control the first switch unit 1 and/or the second switch unit 2 to switch off when the current flowing through the first charging/discharging circuit and/or the second charging/discharging circuit reaches zero after the negative half cycle, and then control the polarity inversion unit 101 to invert the voltage polarity of the charge storage component C. Since the voltage across the charge storage component C after polarity inversion can be added serially with the voltage of battery E1 and voltage of battery E2, the current in the first charging/discharging circuit and/or second charging/discharging circuit can be increased when the first switch unit 1 and/or second switch unit 2 switches on again.

Figure 4A:
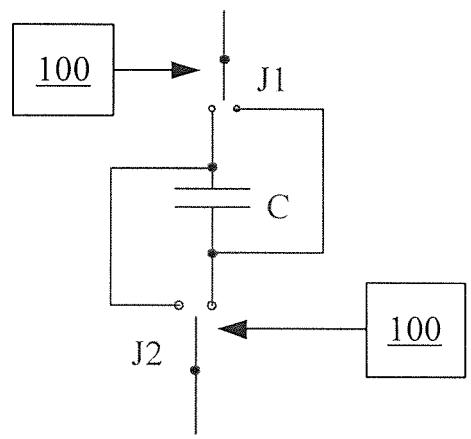
FIGS. 4A-4C are schematic diagrams of one embodiment of the polarity inversion unit shown in FIG. 3.
Figure 4B:
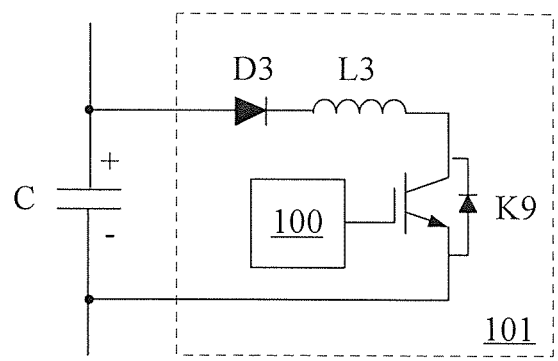
Figure 4C:
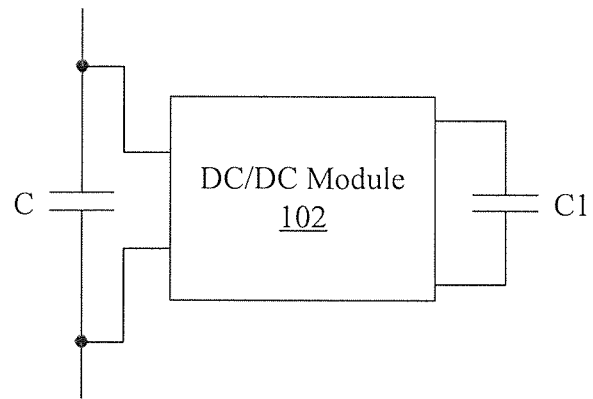

FIG. 4A-4C are schematic diagrams of one embodiment of the polarity inversion unit shown in FIG. 3. Hereunder the embodiments of the polarity inversion unit 101 will be detailed, with reference to FIG. 4A-FIG. 4C.

In one embodiment of the polarity inversion unit 101, as shown in FIG. 4A, the polarity inversion unit 101 comprises a single-pole double-throw switch J1 and a single-pole double-throw switch J2, wherein: the single-pole double-throw switch J1 is arranged at one end of the charge storage component C and the single-pole double-throw switch J2 is arranged at the other end of the charge storage component C; the input wire of the single-pole double-throw switch J1 is connected in the first and second charging/discharging circuits, the first output wire of the single-pole double-throw switch J1 is connected to the first pole plate of the charge storage component C, and the second output wire of the single-pole double-throw switch J1 is connected to the second pole plate of the charge storage component C; the input wire of the single-pole double-throw switch J2 is connected in the first and second charging/discharging circuits, the first output wire of the single-pole double-throw switch J2 is connected to the second pole plate of the charge storage component C, and the second output wire of the single-pole double-throw switch J2 is connected to the first pole plate of the charge storage component C; the switching control module 100 is also connected with the single-pole double-throw switch J1 and single-pole double-throw switch J2 respectively, and is configured to invert the voltage polarity of the charge storage component C by changing the connection relationships between the respective input wire and output wires of the single-pole double-throw switch J1 and the single-pole double-throw switch J2.

In that embodiment, the connection relationships between the respective input wire and output wires of the single-pole double-throw switch J1 and single-pole double-throw switch J2 can be set in advance, so that the input wire of the single-pole double-throw switch J1 is connected with the first output wire of the single-pole double-throw switch J1, while the input wire of the single-pole double-throw switch J2 is connected with the first output wire of the single-pole double-throw switch J2. When the first switch unit 1 and the second switch unit 2 switch off, the input wire of the single-pole double-throw switch J1 can be switched to connect with the second output wire of the single-pole double-throw switch J1, while the input wire of the single-pole double-throw switch J2 is switched to connect to the second output wire of the single-pole double-throw switch J2, under control of the switching control module 100, when the first switch unit 1 and second switch unit 2 switch off, so as to attain the objective of voltage polarity inversion of the charge storage component C.

In another embodiment of the polarity inversion unit 101, as shown in FIG. 4B, the polarity inversion unit 101 comprises a one-way semiconductor component D3, a current storage component L3 and a switch K9, all of which are connected in series with each other, and the series circuit is connected in parallel between the ends of the charge storage component C; the switching control module 100 is also connected with the switch K9, and is configured to invert the voltage polarity of the charge storage component C by controlling the switch K9 to switch on.

In that embodiment, when the first switch unit 1 and second switch unit 2 switch off, the switch K9 can be controlled by the switching control module 100 to switch on, and thereby the charge storage component C, one-way semiconductor component D3, current storage component L3 and switch K9 form a LC oscillation circuit, and the charge storage component C discharges via the current storage component L3; when the current flowing through the current storage component L3 reaches zero after the negative half cycle of current flowing through the oscillation circuit, the voltage polarity of the charge storage component C will be inverted.

In another embodiment of the polarity inversion unit 101, as shown in FIG. 4C, the polarity inversion unit 101 comprises a DC-DC module 102 and a charge storage component C1, wherein: the DC-DC module 102 is connected in series with the charge storage component C and the charge storage component C1 respectively; the switching control module 100 is also connected with the DC-DC module 102, and is configured to transfer the energy in the charge storage component C to the charge storage component C1 and then transfer back the energy in the charge storage component C1 to the charge storage component C by controlling the DC-DC module 102 to operate, so as to invert the voltage polarity of the charge storage component C.

The DC-DC module 102 is a DC-DC conversion circuit for voltage polarity inversion commonly used in the field. Certain embodiments of the present invention do not impose any limitation to the specific circuit structure of the DC-DC module 102, as long as the module can accomplish voltage polarity inversion of the charge storage component C. Those skilled in the art can add, replace, or delete the components in the circuit as needed.

Figure 4D:
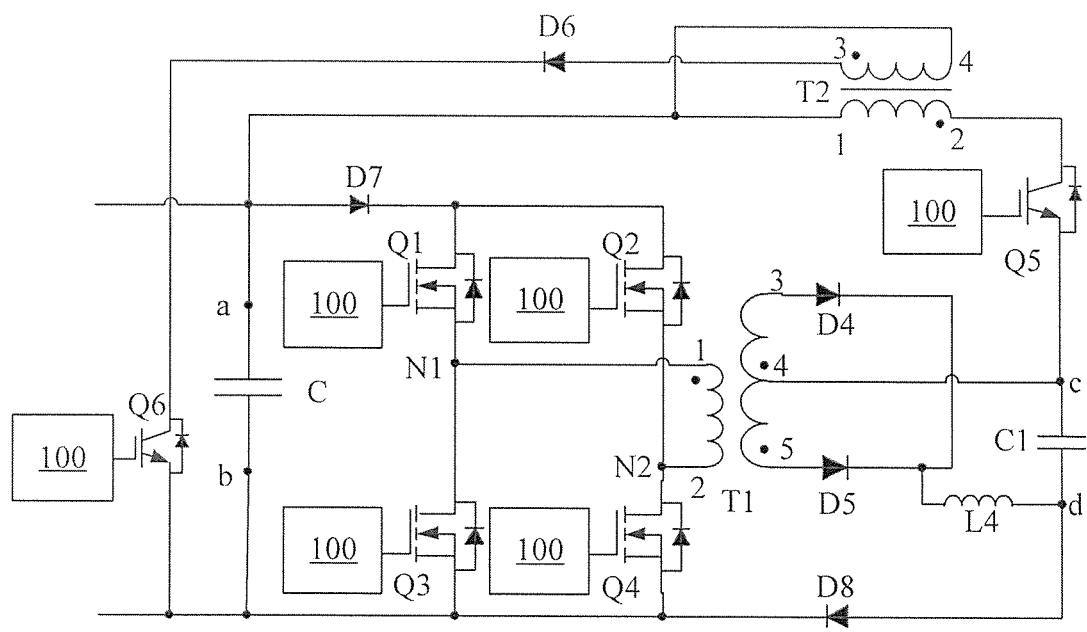
FIG. 4D is a schematic diagram of one embodiment of the DC-DC module shown in FIG. 4C.

FIG. 4D is a schematic diagram of one embodiment of the DC-DC module 102 provided in the present invention. As shown in FIG. 4D, the DC-DC module 102 comprises: a two-way switch Q1, a two-way switch Q2, a two-way switch Q3, a two-way switch Q4, a first transformer T1, a one-way semiconductor component D4, a one-way semiconductor component D5, a current storage component L4, a two-way switch Q5, a two-way switch Q6, a second transformer T2, a one-way semiconductor component D6, a one-way semiconductor component D7 and a one-way semiconductor component D8.

In the embodiment, the two-way switch Q1, two-way switch Q2, two-way switch Q3 and two-way switch Q4 are MOSFETs; the two-way switch Q5 and two-way switch Q6 are IGBTs.

The Pin 1, 4 and 5 of the first transformer T1 are dotted terminals; the pin 2 and 3 of the second transformer T2 are dotted terminals.

Wherein: the positive electrode of the one-way semiconductor component D7 is connected with the end 'a' of the charge storage component C1, and the negative electrode of the one-way semiconductor component D7 is connected with the drain electrode of the two-way switch Q1 and two-way switch Q2, respectively; the source electrode of the two-way switch Q1 is connected with the drain electrode of the two-way switch Q3, and the source electrode of the two-way switch Q2 is connected with the drain electrode of the two-way switch Q4; the source electrodes of the two-way switch Q3 and two-way switch Q4 are connected with the end 'b' of the charge storage component C1 respectively; thus, a full-bridge circuit is formed; here, the voltage polarity of the charge storage component C1 is: end 'a' is positive, while end 'b' is negative.

In the full-bridge circuit, the two-way switch Q1 and two-way switch Q2 constitute the upper bridge arm, while the two-way switch Q3 and two-way switch Q4 constitute the lower bridge arm. The full-bridge circuit is connected with the charge storage component C1 via the first transformer T1; the pin 1 of the first transformer T1 is connected with the first node N1, the pin 2 of the transformer T1 is connected with the second node N2, the pin 3 and pin 5 of the transformer T1 are connected to the positive electrode of the one-way semiconductor component D4 and the positive electrode of the one-way semiconductor component D5, respectively; the negative electrode of one-way semiconductor component D4 and the negative electrode of one-way semiconductor component D5 are connected with one end of the current storage component L4, and the other end of the current storage component L4 is connected with the end 'd' of the charge storage component C1; the pin 4 of the transformer T1 is connected with the end 'c' of the charge storage component C1, the positive electrode of the one-way semiconductor component D8 is connected with the end 'd' of the charge storage component C1, and the negative electrode of the one-way semiconductor component D8 is connected with the end 'b' of the charge storage component C1; here, the voltage polarity of the charge storage component C1 is: end 'c' is negative, while end 'd' is positive.

Wherein: the end 'c' of the charge storage component C1 is connected with the emitter electrode of the two-way switch Q5, the collector electrode of the two-way switch Q5 is connected with the pin 2 of the transformer T2, the pin 1 of the transformer T2 is connected with end 'a' of the charge storage component C, the pin 4 of the transformer T2 is connected with end 'a' of the charge storage component C, the pin 3 of the transformer T2 is connected with the positive electrode of the one-way semiconductor component D6, the negative electrode of the one-way semiconductor component D6 is connected with the collector electrode of the two-way switch Q6, and the emitter electrode of the two-way switch Q6 is connected with the end 'b' of the charge storage component C1.

Wherein: the two-way switch Q1, two-way switch Q2, two-way switch Q3, two-way switch Q4, two-way switch Q5 and two-way switch Q6 are controlled by the switching control module 100 respectively to switch on and switch off.

Hereunder the working process of the DC-DC module 102 will be described:

1. After the first switch unit 1 and second switch unit 2 switch off, the switching control module 100 controls the two-way switch Q5 and two-way switch Q6 to switch off, and control the two-way switch Q1 and two-way switch Q4 to switch on at the same time, to form phase A; control the two-way switch Q2 and two-way switch Q3 to switch on at the same time, to form phase B; by controlling the phase A and phase B to switch on in alternate, a full-bridge circuit is formed;

2. When the full-bridge circuit operates, the energy in the charge storage component C is transferred through the first transformer T1, one-way semiconductor component D4, one-way semiconductor component D5 and current storage component L4 to the charge storage component C1; now, the voltage polarity of the charge storage component C1 is: end 'c' is negative, while end 'd' is positive.

3. The switching control module 100 controls the two-way switch Q5 to gate on, and therefore a path from the charge storage component C1 to the charge storage component C is formed via the second transformer T2 and the one-way semiconductor component D8; thus, the energy in the charge storage component C1 is transferred back to the charge storage component C, wherein: some energy will be stored in the second transformer T2; now, the switching control module 100 controls the two-way switch Q5 to gate off and controls the two-way switch Q6 to gate on, and therefore the energy stored in the second transformer T2 is transferred to the charge storage component C via the second transformer T2 and the one-way semiconductor component D6; now, the voltage polarity of the charge storage component C is inverted to: end 'a' is negative, while end 'b' is positive. Thus, the objective of inverting the voltage polarity of the charge storage component C is attained.

Figure 5A:
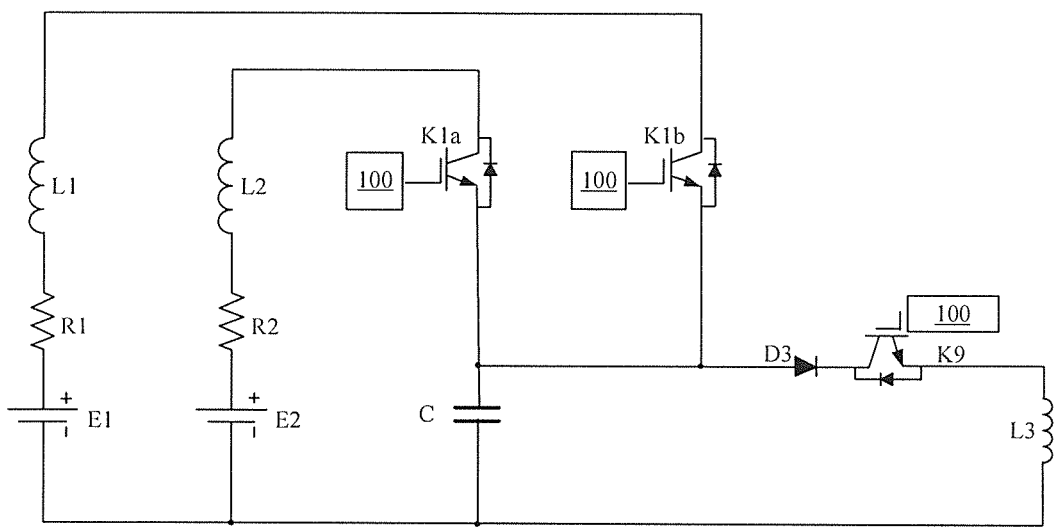
FIG. 5A is a schematic diagram of the second embodiment of the battery heating circuit provided in the present invention.

FIG. 5A is a schematic diagram of the second embodiment of the battery heating circuit provided in the present invention. As shown in FIG. 5A, the first switch unit 1 is switch K1a, the second switch unit 2 is switch K1b, the polarity inversion unit 101 comprises one-way semiconductor component D3, switch K9 and current storage component L3, which are connected in series with each other, and the series circuit is connected in parallel between the ends of the charge storage component C, so as to invert the voltage polarity of the charge storage component C.

Figure 5B:
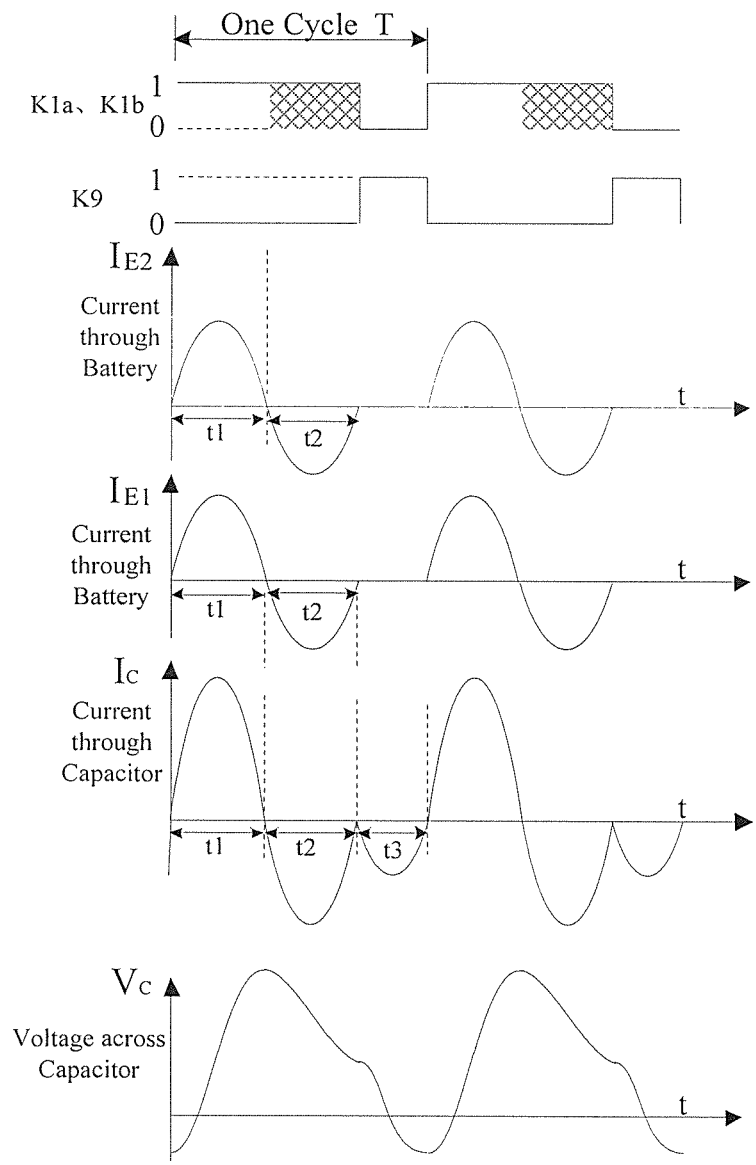
FIG. 5B is a timing sequence diagram of the waveform corresponding to the heating circuit shown in FIG. 5A.

FIG. 5B is a timing sequence diagram of the waveform corresponding to the heating circuit shown in FIG. 5A. Hereunder the operating process of the heating circuit shown in FIG. 5A will be detailed, with reference to FIG. 5B. First, the switching control module 100 controls the switch K1a and switch K1b to switch on, and controls the switch K9 to switch off. Now, the battery E1 and battery E2 charges the charge storage component C simultaneously (see time period t1); when the current $I_{E1}$ flowing through the battery E1 and the current $I_{E2}$ flowing through the battery E2 reach zero after the positive half cycle, the voltage $V_C$ across the charge storage component reaches the peak value, and the charge storage component C starts to charge back the energy stored in it to the battery E1 and battery E2, and the back-charge ends when the current $I_{E1}$ and current $I_{E2}$ reach zero after the negative half cycle (see time period t2); then, the switching control module 100 controls the switch K1a and switch K1b to switch off, and controls the switch K9 to switch on; now, the polarity inversion unit 101 starts to invert the voltage polarity of the charge storage component C, and the polarity inversion ends when the current $I_C$ flowing through the charge storage component C reaches zero after the negative half cycle (see time period t3, at this point, a complete working cycle T has just finished); then, the switching control module 100 controls the switch K9 to switch off. Next, above process can be repeated, so that the current flowing through damping component R1 and damping component R2 continues, and therefore the damping component R1 and damping component R2 generate heat, so as to heat up the battery E1 and battery E2.

FIG. 5B shows the case that the battery E1 and battery E2 are heated up simultaneously. Of course, the first switch unit 1 and second switch unit 2 can be controlled as needed, so as to heat up either battery separately. In addition, the switch-off control of switch K1a and switch K1b can be conducted within the grid section shown in FIG. 5B.

Figure 6A:
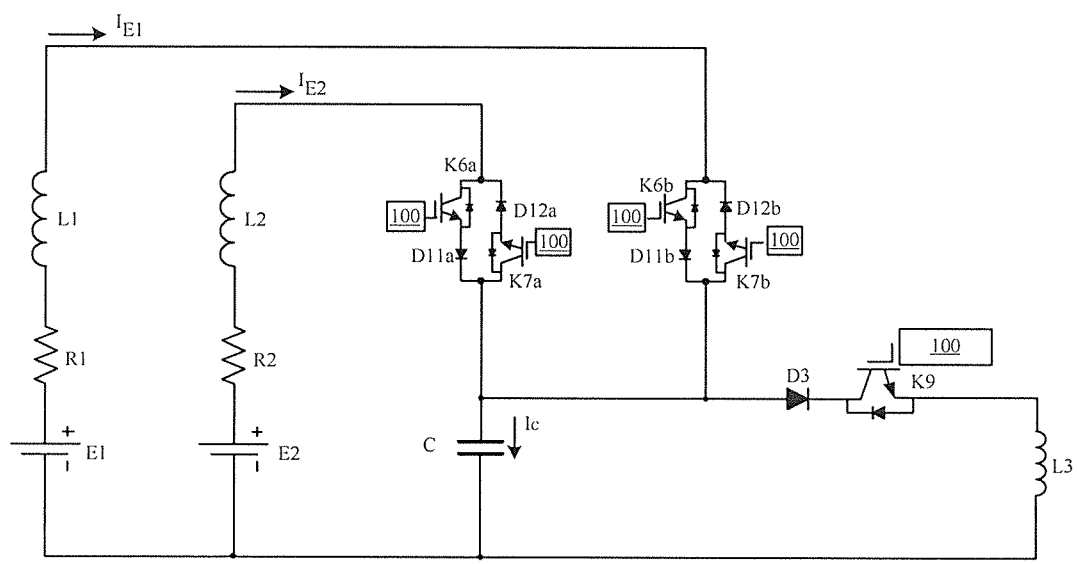
FIG. 6A is a schematic diagram of the third embodiment of the battery heating circuit provided in the present invention.

FIG. 6A is a schematic diagram of a third embodiment of the battery heating circuit provided in the present invention. As shown in FIG. 6A, the first switch unit 1 comprises a first one-way branch composed of a switch K6a and a one-way semiconductor component D11a connected in series and a second one-way branch composed of a switch K7a and a one-way semiconductor component D12a connected in series; the first one-way branch and second one-way branch are connected in parallel opposite to each other. The second switch unit 2 comprises a first one-way branch composed of a switch K6b and a one-way semiconductor component D11b connected in series and a second one-way branch composed of a switch K7b and a one-way semiconductor component D12b connected in series; the first one-way branch and second one-way branch are connected in parallel opposite to each other. The polarity inversion unit 101 comprises a one-way semiconductor component D3, a switch K9 and a current storage component L3, which are connected in series with each other, and the series circuit is connected in parallel between the ends of the charge storage component C, so as to invert the voltage polarity of the charge storage component C.

Figure 6B:
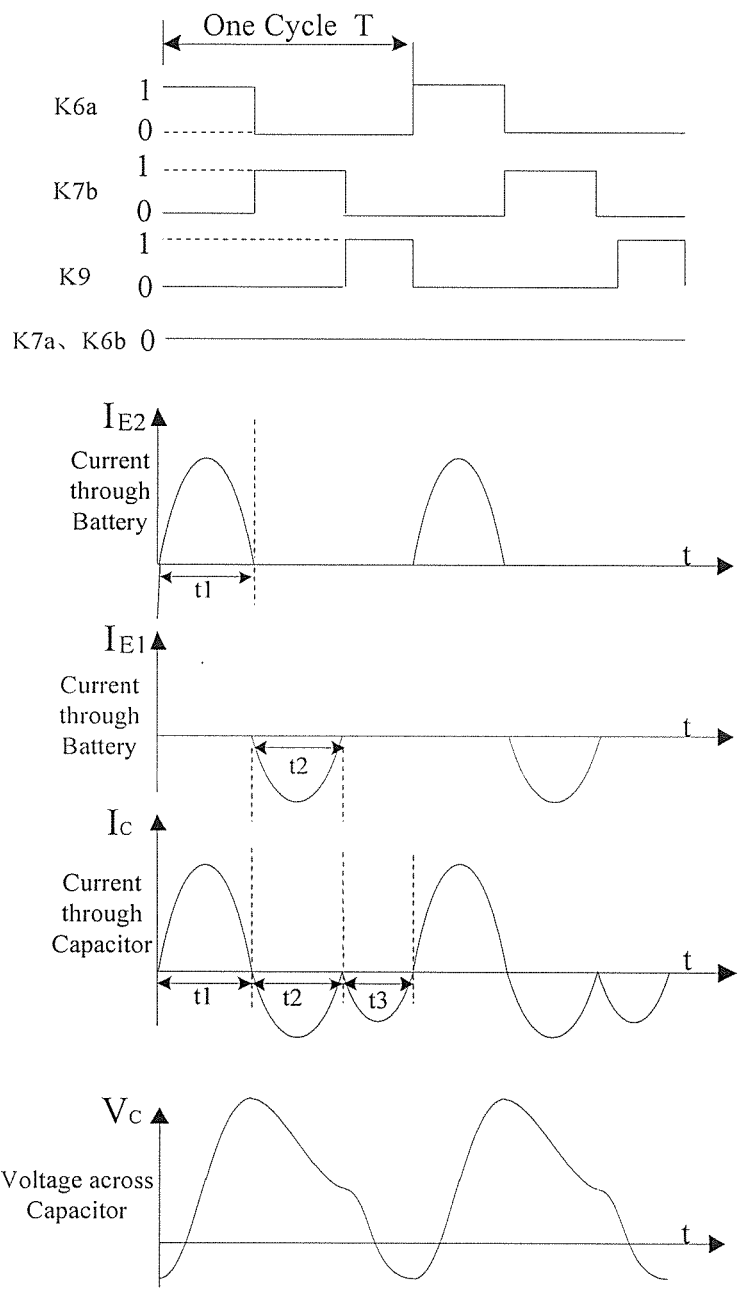
FIG. 6B is a timing sequence diagram of the waveform corresponding to the heating circuit shown in FIG. 6A.

FIG. 6B is a timing sequence diagram of the waveform corresponding to the heating circuit shown in FIG. 6A. Hereunder the operating process of the heating circuit shown in FIG. 6A will be detailed, with reference to FIG. 6B. First, the switching control module 100 controls the switch K6a to switch on, and controls the switch K7b, switch K9, switch K7a and switch K7b to switch off. Now, the battery E2 charges the charge storage component C (see time period t1); when the current $I_{E2}$ flowing through the battery E2 reaches zero after the positive half cycle, the switching control module 100 controls the switch K6a to switch off and controls the switch K7b to switch on, so that the charge storage component C starts to charge back the energy stored in it to the battery E1, and the back-charge ends when the current $I_{E1}$ flowing through the battery E1 reaches zero after the negative half cycle (see time period t2); then, the switching control module 100 controls the switch K6a and switch K7b to switch off, and controls the switch K9 to switch on, so that the polarity inversion unit 101 starts to invert the voltage polarity of the charge storage component C, and the polarity inversion ends when the current $I_C$ flowing through the charge storage component C reaches zero after the negative half cycle (see time period t3, at this point, a complete working cycle T has just finished); then, the switching control module 100 controls the switch K9 to switch off. Next, above process can be repeated, so that the energy in the battery E2 with more electric quantity flows into the charge storage component C, and then the energy flows via the charge storage component C to the battery E1 with less electric quantity, and thereby the objective of electric quantity balance between the batteries is attained. In addition, in that period, there is current flowing through the damping component R1 and damping component R2; therefore, the damping component R1 and damping component R2 generate heat, and heat up the battery E1 and E2.

It should be noted: the objective of heating up the battery can be attained when the battery returns the energy to itself; the objective of heating up the battery and an energy balance function can be attained when the battery returns the energy to itself and transfer partial energy to other batteries. Though a specific heating circuit for battery E1 and battery E2 is only described here, virtually the battery heating circuit can be extended to serve for multiple batteries, and can heat up all the batteries simultaneously, or heat up one or more batteries among the batteries separately, and achieve electric quantity balance among the batteries, according to certain embodiments. Moreover, the durations of the time periods are adjustable, so as to control the effective current values of the batteries.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits.

While some embodiments of the present invention are described above with reference to the accompanying drawings, the present invention is not limited to the details of those embodiments. Those skilled in the art can make modifications and variations, without departing from the spirit of the present invention. However, all these modifications and variations shall be deemed as falling into the scope of the present invention.

In addition, it should be noted that the specific technical features described in the above embodiments can be combined in any appropriate way, provided that there is no conflict. To avoid unnecessary repetition, certain possible combinations are not described specifically. Moreover, the different embodiments of the present invention can be combined as needed, as long as the combinations do not deviate from the spirit of the present invention. However, such combinations shall also be deemed as falling into the scope of the present invention.

Hence, although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A heating circuit for at least a first battery and a second battery, wherein the heating circuit comprises:
    a first charging/discharging circuit, which is connected to the first battery, and comprises a first damping component, a first current storage component, a first switch unit, and a first charge storage component, all of which are connected in a first loop with each other; and
    a second charging/discharging circuit, which is connected to the second battery, and comprises a second damping component, a second current storage component, a second switch unit, and the first charge storage component, all of which are connected in a second loop with each other,
    wherein the first switch unit comprises a first one-way branch configured to transfer energy from the first battery to the first charging/discharging circuit and a second one-way branch configured to transfer energy from the first charging/discharging circuit to the first battery and/or wherein the second switch unit comprises a third one-way branch configured to transfer energy from the second battery to the second charging/discharging circuit and a fourth one-way branch configured to transfer energy from the second charging/discharging unit to the second battery; and
    wherein the first switch unit comprises a first two-way switch and a second two-way switch, which are connected in series opposite to each other to form the first one-way branch and the second one-way branch and/or wherein the second switch unit comprises a third two-way switch and a fourth two-way switch, which are connected in series opposite to each other to form the third one-way branch and the fourth one-way branch.

2. The heating circuit according to claim 1, wherein:
    the first damping component and the second damping component are parasitic resistances in the first battery and the second battery respectively; and
    the first current storage component and the second current storage component are parasitic inductances in the first battery and the second battery respectively.

3. The heating circuit according to claim 1, further comprising a switching control module, which is connected with the first switch unit and the second switch unit, wherein the switching control module is configured to control ON/OFF of the first switch unit and the second switch unit, so that energy flows back-and-forth between the first battery and the first charging/discharging circuit and/or flows back-and-forth between the second battery and the second charging/discharging circuit when the first switch unit and/or the second switch unit switch(es) on.

4. The heating circuit according to claim 1, further comprising a switching control module, which is connected with the first switch unit and the second switch unit, wherein the switching control module is configured to:
control the first switch unit to switch on and control the second switch unit to switch off so that the first battery charges the first charge storage component, when an electric quantity in the first battery is more than an electric quantity in the second battery; and
then, to control the first switch unit to switch off and control the second switch unit to switch on so that the first charge storage component charges back an electric quantity stored in it into the second battery, when a current flowing through the first charging/discharging circuit reaches zero after a positive half cycle.

5. The heating circuit according to claim 1, wherein: the first switch unit includes a first two-way switch and/or the second switch unit includes a second two-way switch.

6. The heating circuit according to claim 1, wherein: the first switch unit comprises a first switch, a first one-way semiconductor component and a second one-way semiconductor component, wherein: the first switch and the first one-way semiconductor component are connected in series with each other to form the first one-way branch, and the second one-way semiconductor component forms the second one-way branch and/or wherein the second switch unit comprises a second switch, a third one-way semiconductor component and a fourth one-way semiconductor component, wherein: the second switch and the third one-way semiconductor component are connected in series with each other to form the third one-way branch, and the fourth one-way semiconductor component forms the fourth one-way branch.

7. The battery heating circuit according to claim 6, wherein: the first switch unit further comprises a third switch in the second one-way branch, which is connected in series with the second one-way semiconductor component and/or wherein the second switch unit further comprises a fourth switch in the fourth one-way branch, which is connected in series with the fourth one-way semiconductor component.

8. The battery heating circuit according to claim 1, wherein: the first switch unit further comprises a first resistor that is connected in series with the first one-way branch and/or the second one-way branch and/or wherein the second switch unit further comprises a second resistor that is connected in series with the third one-way branch and/or the fourth one-way branch.

9. The heating circuit according to claim 1, further comprising a polarity inversion unit, which is connected with the first charge storage component, wherein the polarity inversion unit is configured to invert a voltage polarity of the first charge storage component.

10. A heating circuit for at least a first battery and a second battery, wherein the heating circuit comprises:
a first charging/discharging circuit, which is connected to the first battery, and comprises a first damping component, a first current storage component, a first switch unit, and a first charge storage component, all of which are connected in a first loop with each other; and
a second charging/discharging circuit, which is connected to the second battery, and comprises a second damping component, a second current storage component, a second switch unit, and the first charge storage component, all of which are connected in a second loop with each other;
a polarity inversion unit, which is connected with the first charge storage component, wherein the polarity inversion unit is configured to invert a voltage polarity of the first charge storage component;
wherein:
the polarity inversion unit comprises a first single-pole double-throw switch and a second single-pole double-throw switch,
the first single-pole double-throw switch is arranged at a first end of the first charge storage component, while the second single-pole double-throw switch is arranged at a second end of the first charge storage component,
an input wire of the first single-pole double-throw switch is connected in the first charging/discharging circuit and the second charging/discharging circuit, a first output wire of the first single-pole double-throw switch is connected to a first pole plate of the first charge storage component, and a second output wire of the first single-pole double-throw switch is connected to a second pole plate of the first charge storage component; and
an input wire of the second single-pole double-throw switch is connected in the first charging/discharging circuit and the second charging/discharging circuit, a first output wire of the second single-pole double-throw switch is connected to the second pole plate of the first charge storage component, and a second output wire of the second single-pole double-throw switch is connected to the first pole plate of the first charge storage component.

11. A heating circuit for at least a first battery and a second battery, wherein the heating circuit comprises:
a first charging/discharging circuit, which is connected to the first battery, and comprises a first damping component, a first current storage component, a first switch unit, and a first charge storage component, all of which are connected in a first loop with each other; and
a second charging/discharging circuit, which is connected to the second battery, and comprises a second damping component, a second current storage component, a second switch unit, and the first charge storage component, all of which are connected in a second loop with each other;
a polarity inversion unit, which is connected with the first charge storage component, wherein the polarity inversion unit is configured to invert a voltage polarity of the first charge storage component;
wherein: the polarity inversion unit comprises a one-way semiconductor component, a third current storage component and a switch, all of which are connected in series with each other, and the series circuit is connected in parallel between ends of the first charge storage component.

12. A heating circuit for at least a first battery and a second battery, wherein the heating circuit comprises:
a first charging/discharging circuit, which is connected to the first battery, and comprises a first damping component, a first current storage component, a first switch unit, and a first charge storage component, all of which are connected in a first loop with each other; and
a second charging/discharging circuit, which is connected to the second battery, and comprises a second damping component, a second current storage component, a second switch unit, and the first charge storage component, all of which are connected in a second loop with each other;
a polarity inversion unit, which is connected with the first charge storage component, wherein the polarity inversion unit is configured to invert a voltage polarity of the first charge storage component;

wherein: the polarity inversion unit comprises a DC-DC module and a second charge storage component, the DC-DC module is connected with the first charge storage component and the second charge storage component respectively, and the DC-DC module is configured to transfer an electric quantity in the first charge storage component to the second charge storage component, and then transfer back the electric quantity in the second charge storage component to the first charge storage component, so as to achieve inversion of voltage polarity of the first charge storage component.

13. A heating circuit for at least a first battery and a second battery, wherein the heating circuit comprises:

a first charging/discharging circuit, which is connected to the first battery, and comprises a first damping component, a first current storage component, a first switch unit, and a first charge storage component, all of which are connected in a first loop with each other; and a second charging/discharging circuit, which is connected to the second battery, and comprises a second damping component, a second current storage component, a second switch unit, and the first charge storage component, all of which are connected in a second loop with each other;

a polarity inversion unit, which is connected with the first charge storage component, wherein the polarity inversion unit is configured to invert a voltage polarity of the first charge storage component;

a switching control module, which is connected with the first switch unit, the second switch unit and the polarity inversion unit, and the switching control module is configured to control the first switch unit and/or the second switch unit to switch off when a current flowing through the first charging/discharging circuit and/or the second charging/discharging circuit reaches zero after a negative half cycle, and then control the polarity inversion unit to invert a voltage polarity of the first charge storage component.

* * * * *